United States Patent
Holm et al.

(10) Patent No.: US 7,257,762 B2
(45) Date of Patent: Aug. 14, 2007

(54) MEMORY INTERFACE WITH WRITE BUFFER AND ENCODER

(75) Inventors: Jeffrey J. Holm, Eden Prairie, MN (US); David Parker, Eagan, MN (US); Bradley J. Winter, St. Louis Park, MN (US)

(73) Assignee: LSI Corporation, Milpitas, CA (US)

( * ) Notice: Subject to any disclaimer, the term of this patent is extended or adjusted under 35 U.S.C. 154(b) by 491 days.

(21) Appl. No.: 10/960,492

(22) Filed: Oct. 7, 2004

(65) Prior Publication Data

US 2006/0080589 A1  Apr. 13, 2006

(51) Int. Cl.
*G11C 29/00* (2006.01)
(52) U.S. Cl. ...................................... 714/763
(58) Field of Classification Search ................. 714/763

See application file for complete search history.

(56) References Cited

U.S. PATENT DOCUMENTS

| | | | |
|---|---|---|---|
| 5,226,043 A * | 7/1993 | Pughe et al. | 714/768 |
| 5,453,999 A * | 9/1995 | Michaelson et al. | 714/805 |
| 5,663,969 A * | 9/1997 | Tsou | 714/805 |

* cited by examiner

*Primary Examiner*—Shelly Chase
(74) *Attorney, Agent, or Firm*—Westman, Champlin, & Kelly

(57) ABSTRACT

A method and apparatus are provided for interfacing between a data source and a tightly-coupled memory. In the method and apparatus, a write data word and a write address are received from the data source and latched in a first clock cycle within a write buffer along a write data path, between the data source and the memory. The write data word is encoded according to an error detection code along the write data path. The write address and the write data word are applied to the memory from the write buffer. The write data word is accessible to the data source from the write data path or the memory beginning with a second clock cycle, which is a next subsequent clock cycle to the first clock cycle.

19 Claims, 6 Drawing Sheets

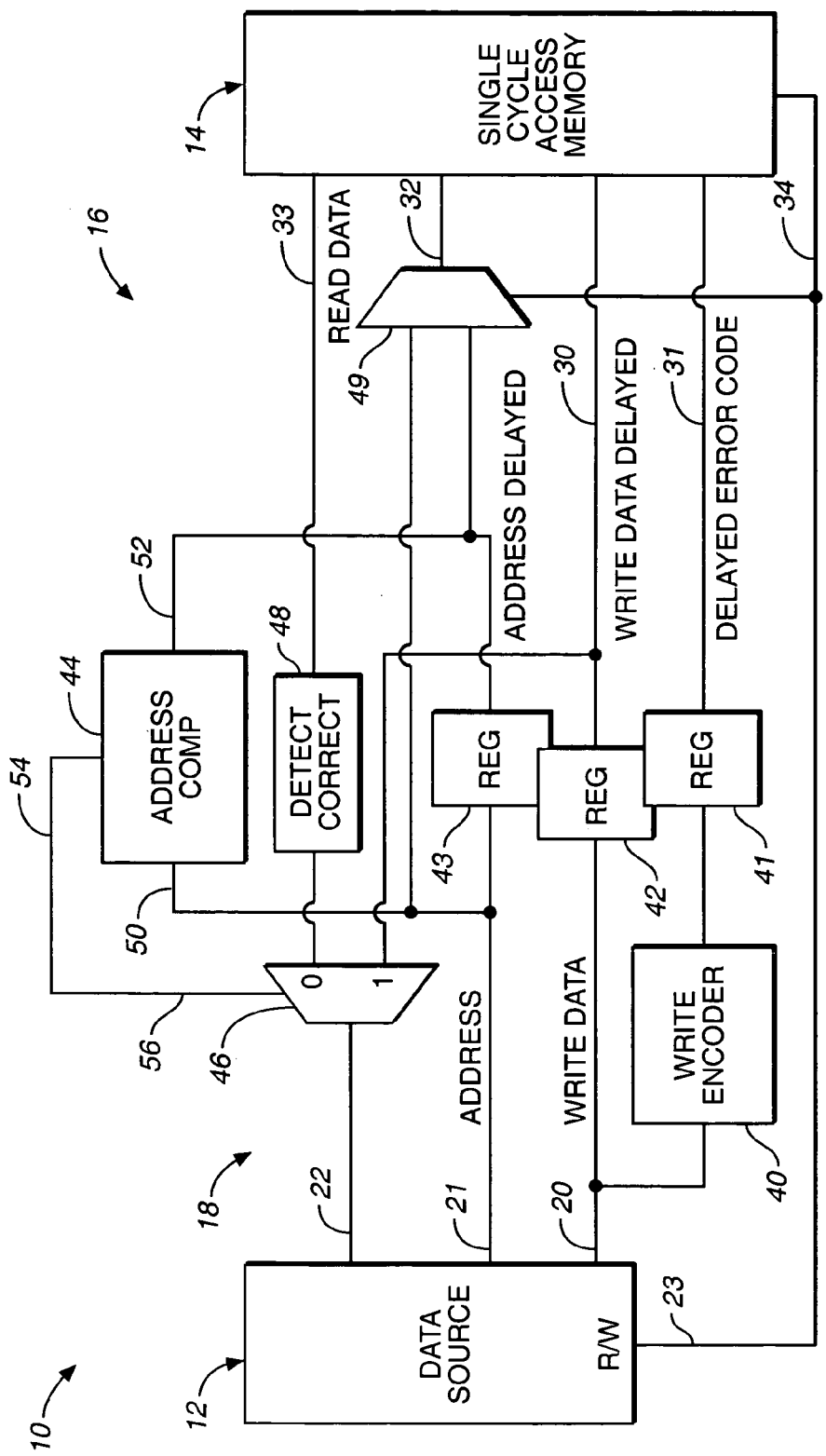
FIG._1

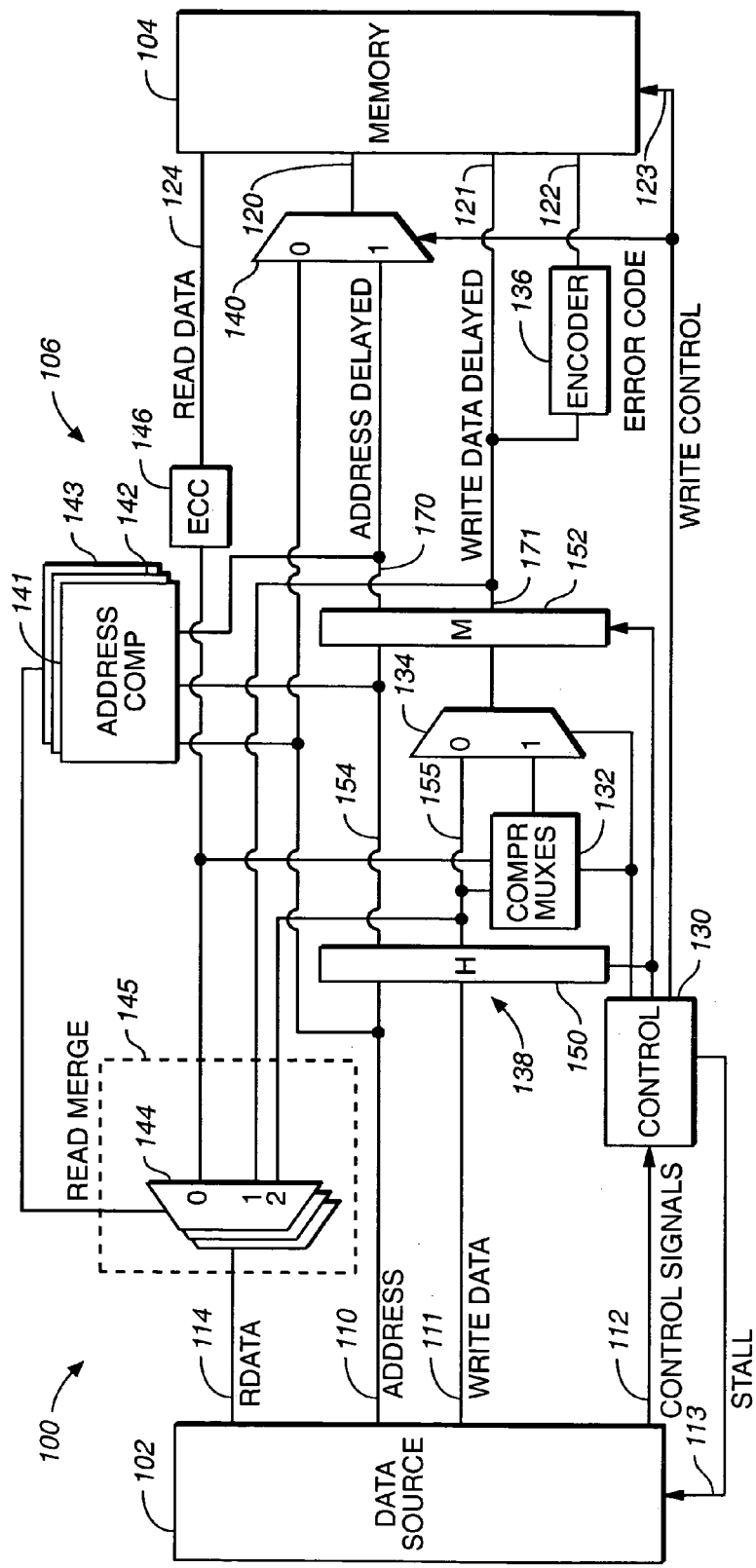
FIG._2

Read Merge (RM) -Data Source Table

| HOLD_CMP | MERGE_CMP | HOLDMERGE_CMP | HoldRegEmpty&&MergeRegEmpty | HoldRegEmpty&&MergeRegFull | HoldRegPartial&&MergeRegEmpty | HoldRegPartial&&MergeRegFull | HoldRegFull&&MergeRegFull | HoldRegFull&&MergeRegEmpty | CSM_RDMRG_CNTRL[1:0] | |
|---|---|---|---|---|---|---|---|---|---|---|
| X | X | X | 1 | 0 | 0 | 0 | 0 | 0 | 00 | ReadxTCM [1] |
| X | 0 | X | 0 | 1 | 0 | 0 | 0 | 0 | 00 | ReadxTCM [1] |
| X | 1 | X | 0 | 1 | 0 | 0 | 0 | 0 | 10 | Read Merge Register [2] |
| 0 | X | X | 0 | 0 | 1 | 0 | 0 | 0 | 00 | ReadxTCM [1] |
| 1 | X | X | 0 | 0 | 1 | 0 | 0 | 0 | 11 | Merge the Content of The xTCM and the Hold Register [3] |
| 0 | 0 | 0 | 0 | 0 | 0 | 1 | 0 | 0 | 00 | ReadxTCM [1] |
| 1 | 0 | 0 | 0 | 0 | 0 | 1 | 0 | 0 | 11 | Merge the Content Of the xTCM and the Hold Register [3] |
| 0 | 1 | 0 | 0 | 0 | 0 | 1 | 0 | 0 | 10 | Read Merge Register [2] |
| 1 | 1 | 1 | 0 | 0 | 0 | 1 | 0 | 0 | 10 | Gather Hold in Merge Register and Read From Merge [4] |
| 0 | 0 | 1 | 0 | 0 | 0 | 1 | 0 | 0 | 00 | Gather Hold in Merge Register and Read xTCM [5] |
| 0 | 0 | 0 | 0 | 0 | 0 | 0 | 1 | 0 | 00 | ReadxTCM [1] |
| 1 | 0 | 0 | 0 | 0 | 0 | 0 | 1 | 0 | 01 | Read Hold Register [6] |
| 0 | 1 | 0 | 0 | 0 | 0 | 0 | 1 | 0 | 10 | Read Merge Register [2] |
| 1 | 1 | 1 | 0 | 0 | 0 | 0 | 1 | 0 | 10 | Clobber Merge with Hold Register and Read from Merge [2] |
| 0 | 0 | 1 | 0 | 0 | 0 | 0 | 1 | 0 | 00 | Clobber Merge with Hold Register and Read from xTCM [8] |
| 0 | X | X | 0 | 0 | 0 | 0 | 0 | 1 | 00 | ReadxTCM [1] |
| 1 | X | X | 0 | 0 | 0 | 0 | 0 | 1 | 01 | Read Hold Register [6] |

FIG._3

Table 2.1 CSM State Table

| | | FSM Inputs | | | | | | | FSM Outputs | | | | | | | | | | Current State | | | | | | Next State | | | | | |
|---|---|---|---|---|---|---|---|---|---|---|---|---|---|---|---|---|---|---|---|---|---|---|---|---|---|---|---|---|---|---|---|
| | | CSM_CS | CSM_nRW | WordWrite | SubwordWrite | CSM_HOLD_CMP | CSM_MERGE_CMP | CSM_HOLDMERGE_CMP | Wait | WAIT | TCM_CS | TCM_nRW | LD_HOLD | LD_MERGE[1:0] | RD_CNTRL | WD_CNTRL | CSM_RDMRG_CNTRL[1:0] | CSM_ADDR_CNTRL[1:0] | CSM_LD_PRD | HoldRegEmpty&&MergeRegEmpty | HoldRegEmpty&&MergeRegFull | HoldRegPartial&&MergeRegEmpty | HoldRegPartial&&MergeRegFull | HoldRegFull&&MergeRegEmpty | HoldRegFull&&MergeRegFull | HoldRegEmpty&&MergeRegEmpty | HoldRegEmpty&&MergeRegFull | HoldRegPartial&&MergeRegEmpty | HoldRegPartial&&MergeRegFull | HoldRegFull&&MergeRegEmpty | HoldRegFull&&MergeRegFull |
| | | 1 | 1 | 1 | 0 | X | X | X | 0 | 0 | 0 | 0 | 1 | 10 | 0 | 0 | 00 | 00 | 0 | 1 | 0 | 0 | 0 | 0 | 0 | 0 | 0 | 0 | 0 | 0 | 1 |
| | | 1 | 1 | 1 | 0 | X | X | X | 0 | 0 | 1 | 1 | 1 | 10 | 0 | 0 | 00 | 01 | 0 | 0 | 1 | 0 | 0 | 0 | 0 | 0 | 0 | 0 | 0 | 0 | 1 |
| Word Write Operation | | 1 | 1 | 1 | 0 | X | X | X | 0 | 0 | 0 | 0 | 1 | 00 | 0 | 1 | 00 | 00 | 0 | 0 | 0 | 1 | 0 | 0 | 0 | 0 | 0 | 0 | 0 | 1 | 0 |
| | | 1 | 1 | 1 | 0 | X | X | 0 | 0 | 0 | 1 | 1 | 1 | 00 | 0/1 | 1 | 00 | 01 | 0 | 0 | 0 | 0 | 1 | 0 | 0 | 0 | 0 | 0 | 0 | 1 | 0 |
| | | 1 | 1 | 1 | 0 | X | X | 1 | 0 | 0 | 0 | 0 | 1 | 01 | 0 | 0 | 00 | 00 | 0 | 0 | 0 | 0 | 1 | 0 | 0 | 0 | 0 | 0 | 0 | 1 | 0 |
| | | 1 | 1 | 1 | 0 | X | X | 0 | 0 | 0 | 1 | 1 | 1 | 00 | 0 | 0 | 00 | 01 | 0 | 0 | 0 | 0 | 0 | 1 | 0 | 0 | 0 | 0 | 0 | 1 | 0 |
| | | 1 | 1 | 1 | 0 | X | X | 1 | 0 | 0 | 0 | 0 | 1 | 00 | 0 | 0 | 00 | 00 | 0 | 0 | 0 | 0 | 0 | 1 | 0 | 0 | 0 | 0 | 0 | 1 | 0 |
| | | 1 | 1 | 1 | 0 | X | X | X | 0 | 0 | 0 | 0 | 1 | 00 | 0 | 0 | 00 | 00 | 0 | 0 | 0 | 0 | 0 | 0 | 1 | 0 | 0 | 0 | 0 | 1 | 0 |

FIG._4A

Table 2.1 CSM State Table

| | FSM Inputs | | | | | | | | FSM Outputs | | | | | | | | | | Current State | | | | | | Next State | | | | | |
|---|---|---|---|---|---|---|---|---|---|---|---|---|---|---|---|---|---|---|---|---|---|---|---|---|---|---|---|---|---|---|
| | CSM_CS | CSM_nRW | WordWrite | SubwordWrite | CSM_HOLD_CMP | CSM_MERGE_CMP | CSM_HOLDMERGE_CMP | Wait | WAIT | TCM_CS | TCM_nRW | LD_HOLD | LD_MERGE[1:0] | RD_CNTRL | WD_CNTRL | CSM_RDMRG_CNTRL[1:0] | CSM_ADDR_CNTRL[1:0] | CSM_LD_PRD | HoldRegEmpty&&MergeRegEmpty | HoldRegEmpty&&MergeRegFull | HoldRegPartial&&MergeRegEmpty | HoldRegPartial&&MergeRegFull | HoldRegFull&&MergeRegFull | HoldRegFull&&MergeRegEmpty | HoldRegEmpty&&MergeRegEmpty | HoldRegEmpty&&MergeRegFull | HoldRegPartial&&MergeRegEmpty | HoldRegPartial&&MergeRegFull | HoldRegFull&&MergeRegFull | HoldRegFull&&MergeRegEmpty |
| Subword Write Operation | 1 | 1 | 0 | 1 | X | X | X | 0 | 0 | 1 | 0 | 1 | 10 | 0 | 0 | 00 | 00 | 0 | 1 | 0 | 0 | 0 | 0 | 0 | 0 | 0 | 1 | 0 | 0 | 0 |
| | 1 | 1 | 0 | 1 | X | X | X | 0 | 0 | 1 | 0 | 1 | 10 | 0 | 0 | 00 | 00 | 0 | 0 | 1 | 0 | 0 | 0 | 0 | 0 | 0 | 0 | 1 | 0 | 0 |
| | 1 | 1 | 0 | 1 | X | X | X | 0 | 0 | 1 | 0 | 1 | 00 | 0 | 1 | 00 | 00 | 0 | 0 | 0 | 1 | 0 | 0 | 0 | 0 | 0 | 0 | 1 | 0 | 0 |
| | 1 | 1 | 0 | 1 | X | X | 0 | 1 | 1 | 1 | 1 | 1 | 00 | 0/1 | 1 | 00 | 01 | 0 | 0 | 0 | 0 | 1 | 0 | 0 | 0 | 0 | 0 | 1 | 0 | 0 |
| | X | X | X | X | X | X | X | 1 | 0 | 1 | 0 | 0 | 10 | 0 | 0 | 00 | 10 | 0 | 0 | 0 | 0 | 1 | 0 | 0 | 0 | 0 | 0 | 1 | 0 | 0 |
| | 1 | 1 | 0 | 1 | X | X | 1 | 0 | 0 | 1 | 0 | 1 | 01 | 0 | 0 | 00 | 00 | 0 | 0 | 0 | 0 | 1 | 0 | 0 | 0 | 0 | 0 | 1 | 0 | 0 |
| | 1 | 1 | 0 | 1 | X | X | 0 | 1 | 1 | 1 | 1 | 1 | 00 | 0 | 0 | 00 | 01 | 0 | 0 | 0 | 0 | 0 | 1 | 0 | 0 | 0 | 0 | 1 | 0 | 0 |
| | X | X | X | X | X | X | X | 1 | 0 | 1 | 0 | 0 | 10 | 0 | 0 | 00 | 10 | 0 | 0 | 0 | 0 | 0 | 1 | 0 | 0 | 0 | 0 | 1 | 0 | 0 |
| | 1 | 1 | 0 | 1 | X | X | 1 | 0 | 0 | 1 | 0 | 1 | 01 | 0 | 0 | 00 | 00 | 0 | 0 | 0 | 0 | 0 | 1 | 0 | 0 | 0 | 0 | 0 | 1 | 0 |
| | 1 | 1 | 0 | 1 | X | X | X | 0 | 0 | 1 | 0 | 1 | 00 | 0 | 0 | 00 | 00 | 0 | 0 | 0 | 0 | 0 | 0 | 1 | 0 | 0 | 1 | 0 | 0 | 0 |

FIG._4B

Table 2.1  CSM State Table

| | FSM Inputs | | | | | | | | FSM Outputs | | | | | | | | | | Current State | | | | | | Next State | | | | | |
|---|---|---|---|---|---|---|---|---|---|---|---|---|---|---|---|---|---|---|---|---|---|---|---|---|---|---|---|---|---|---|---|
| | CSM_CS | CSM_nRW | WordWrite | SubwordWrite | CSM_HOLD_CMP | CSM_MERGE_CMP | CSM_HOLDMERGE_CMP | Wait | CSM_WAIT | CSM_TCM_CS | CSM_TCM_nRW | CSM_LD_HOLD | CSM_LD_MERGE[1:0] | CSM_RD_CNTRL | CSM_WD_CNTRL | CSM_RDMRG_CNTRL[1:0] | CSM_ADDR_CNTRL[1:0] | CSM_LD_PRD | HoldRegEmpty&&MergeRegEmpty | HoldRegEmpty&&MergeRegFull | HoldRegPartial&&MergeRegEmpty | HoldRegPartial&&MergeRegFull | HoldRegFull&&MergeRegEmpty | HoldRegFull&&MergeRegFull | HoldRegEmpty&&MergeRegEmpty | HoldRegEmpty&&MergeRegFull | HoldRegPartial&&MergeRegEmpty | HoldRegPartial&&MergeRegFull | HoldRegFull&&MergeRegEmpty | HoldRegFull&&MergeRegFull |
| Read Operation | 1 | 0 | X | X | X | X | X | 0 | 0 | 1 | 0 | 0 | 10 | 0 | 0 | 00 | 00 | 0 | 1 | 0 | 0 | 0 | 0 | 0 | 1 | 0 | 0 | 0 | 0 | 0 |
| | 1 | 0 | X | X | X | 0 | X | 0 | 0 | 1 | 0 | 0 | 10 | 0 | 0 | 00 | 00 | 0 | 0 | 1 | 0 | 0 | 0 | 0 | 0 | 1 | 0 | 0 | 0 | 0 |
| | 1 | 0 | X | X | X | 1 | X | 0 | 0 | 1 | 0 | 0 | 10 | 0 | 0 | 10 | 00 | 0 | 0 | 1 | 0 | 0 | 0 | 0 | 0 | 1 | 0 | 0 | 0 | 0 |
| | 1 | 0 | X | X | 0 | X | X | 0 | 0 | 1 | 0 | 0 | 00 | 0 | 1 | 00 | 00 | 0 | 0 | 0 | 1 | 0 | 0 | 0 | 0 | 1 | 0 | 0 | 0 | 0 |
| | 1 | 0 | X | X | 1 | X | X | 0 | 0 | 1 | 0 | 0 | 00 | 0 | 1 | 11 | 00 | 0 | 0 | 0 | 1 | 0 | 0 | 0 | 0 | 1 | 0 | 0 | 0 | 0 |
| | 1 | 0 | X | X | 0 | 0 | 0 | 0 | 0 | 1 | 0 | 0 | 10 | 0 | 0 | 00 | 00 | 1 | 0 | 0 | 0 | 1 | 0 | 0 | 0 | 0 | 0 | 1 | 0 | 0 |
| | 1 | 0 | X | X | 1 | 0 | 0 | 0 | 0 | 1 | 0 | 0 | 10 | 0 | 0 | 11 | 00 | 1 | 0 | 0 | 0 | 1 | 0 | 0 | 0 | 0 | 0 | 1 | 0 | 0 |
| | 1 | 0 | X | X | 0 | 1 | 0 | 0 | 0 | 1 | 0 | 0 | 10 | 0 | 0 | 10 | 00 | 1 | 0 | 0 | 0 | 1 | 0 | 0 | 0 | 0 | 0 | 1 | 0 | 0 |
| | 1 | 0 | X | X | 1 | 1 | 1 | 0 | 0 | 1 | 0 | 0 | 01 | 0 | 0 | 10 | 00 | 0 | 0 | 0 | 0 | 1 | 0 | 0 | 0 | 1 | 0 | 0 | 0 | 0 |
| | 1 | 0 | X | X | 0 | 0 | 1 | 0 | 0 | 1 | 0 | 0 | 01 | 0 | 0 | 00 | 00 | 0 | 0 | 0 | 0 | 1 | 0 | 0 | 0 | 1 | 0 | 0 | 0 | 0 |
| | 1 | 0 | X | X | 0 | 0 | 0 | 0 | 0 | 1 | 0 | 0 | 10 | 0 | 0 | 00 | 00 | 0 | 0 | 0 | 0 | 0 | 1 | 0 | 0 | 0 | 0 | 0 | 1 | 0 |
| | 1 | 0 | X | X | 1 | 0 | 0 | 0 | 0 | 1 | 0 | 0 | 10 | 0 | 0 | 01 | 00 | 0 | 0 | 0 | 0 | 0 | 1 | 0 | 0 | 0 | 0 | 0 | 1 | 0 |
| | 1 | 0 | X | X | 0 | 1 | 0 | 0 | 0 | 1 | 0 | 0 | 10 | 0 | 0 | 10 | 00 | 0 | 0 | 0 | 0 | 0 | 1 | 0 | 0 | 0 | 0 | 0 | 1 | 0 |
| | 1 | 0 | X | X | 1 | 1 | 1 | 0 | 0 | 1 | 0 | 0 | 00 | 0 | 0 | 10 | 00 | 0 | 0 | 0 | 0 | 0 | 1 | 0 | 0 | 1 | 0 | 0 | 0 | 0 |
| | 1 | 0 | X | X | 0 | 0 | 1 | 0 | 0 | 1 | 0 | 0 | 00 | 0 | 0 | 00 | 00 | 0 | 0 | 0 | 0 | 0 | 1 | 0 | 0 | 1 | 0 | 0 | 0 | 0 |
| | 1 | 0 | X | X | 0 | X | X | 0 | 0 | 1 | 0 | 0 | 00 | 0 | 0 | 00 | 00 | 0 | 0 | 0 | 0 | 0 | 0 | 1 | 0 | 1 | 0 | 0 | 0 | 0 |
| | 1 | 0 | X | X | 1 | X | X | 0 | 0 | 1 | 0 | 0 | 00 | 0 | 0 | 01 | 00 | 0 | 0 | 0 | 0 | 0 | 0 | 1 | 0 | 1 | 0 | 0 | 0 | 0 |

FIG._4C

MEMORY INTERFACE WITH WRITE BUFFER AND ENCODER

FIELD OF THE INVENTION

The present invention relates to semiconductor integrated circuits and, more particularly to the generation of error detection and/or correction codes in memory interfaces.

BACKGROUND OF THE INVENTION

Codes have been used to detect and/or correct errors in data that has been stored in memory or transmitted from one location to another. A simple error detection code is based on parity. A parity bit is added to a group of data bits, such as a data word, and has a logic state that is selected to make the total number of "1s" (or "0s") in the data word either even or odd. The original data word is then transmitted or stored along with the additional parity bit as a modified data word. In a memory storage system, when the modified data word is read from memory a detection circuit checks the parity of the modified data word against an expected value. If the parity is correct, the detection circuit assumes there are no bit errors. If the parity is incorrect, the detection circuit assumes there is an error in the retrieved data.

More complex error correction codes (ECCs) have also been used for enabling not only detection of errors but also correction of the detected errors. For example, a single-error correction, double-error detection (SEC-DED) Hamming code adds enough additional parity bits to enable the detection circuit to detect and correct any single-bit error in a data word and detect double-bit errors. Other types of error correction codes include convolution (tree) codes and other block codes. In these types of ECC codes, one or more data words are divided into blocks of data and each block of data is encoded into a longer block of data. With convolution codes, the encoding of one block of data depends on the state of the encoder as well as the data to be encoded. With block codes, each block of data is encoded independently from every other block of data.

Recently, there has been an increased interest in using ECC codes while writing data to and reading data from integrated circuit memories, such as random access memories (RAMs), dynamic random access memories (DRAMs), and double data rate (DDR) DRAMs. These memories can be embedded on the integrated circuit containing the data source or can be external to the integrated circuit. The use of ECC codes with integrated circuit memories has been found to reduce problems with random cell errors in memory arrays.

However, the introduction of error code generation circuitry within the write data path, between the data source and the memory, can negatively affect the performance of the memory since the new circuitry adds delay to this critical timing path. This is particularly true with certain data sources, such as processors that require access to the memory within a single clock cycle. One example of such a configuration is a processor having a "tightly-coupled memory."

Due to continually shrinking technology feature sizes and the inherent lower voltage thresholds ($V_H$, $V_L$), configurations as those mentioned above, namely the "tightly-coupled memory", are more susceptible to the effects of cosmic radiation. The cosmic radiation (charged particles), and the effect on the voltage thresholds is the cause for the increase in memory soft error rates.

Another difficulty with implementing error detection and/or correction codes occurs when the memory interface must support byte-based memory accesses while implementing word-based ECC codes. A word-based ECC code is more desirable than a byte-based ECC code since a word-based ECC code requires less code bits. For example, a byte-based ECC code may require 52 bits for a 32-bit data word while a word-based ECC code may require only 39 bits. The data words can have any number of bits.

Byte write accesses with word-based ECC codes are accomplished through "read/modify/write" operations. A read/modify/write operation is performed when the data source attempts to write a smaller number of bits (such as a byte) than the width of the ECC block (such as a data word). An ECC block is defined as the basic unit of data from which the ECC bits apply. When partial ECC block writes are executed, the memory interface must read the original data that is stored in the targeted memory location and then merge that read data with the new data, byte or half-word, to form a full ECC block. The appropriate ECC bits are then generated for the full ECC block and the data is written to memory. This read/modify/write operation can take a number of extra clock cycles to complete due to wait state and/or higher priority read operations, for example.

Improved memory interfaces are therefore desired, which do not significantly impact the critical timing paths to the memory and which allow partial writes without significantly impacting the latency seen by the data source.

SUMMARY OF THE INVENTION

One embodiment of the present invention is directed to a method of interfacing between a data source and a memory. In the method, a write data word and a write address are received from the data source and latched in a first clock cycle within a write buffer along a write data path, between the data source and the memory. The write data word is encoded according to an error detection code along the write data path. The write address and the write data word are applied to the memory from the write buffer. The write data word is accessible to the data source from the write data path or the memory beginning with a second clock cycle, which is the subsequent clock cycle to the first clock cycle.

Another embodiment of the present invention is an integrated circuit data storage and retrieval device. The device includes a memory and a data source for providing write data words, corresponding write addresses, and read addresses to the memory. A write data path extends from the data source to the memory. The write data path includes a write buffer and an error detection encoder. The write buffer latches the write data words and write addresses prior to applying the write data words and write addresses to the memory. A read data path extends from the memory to the data source. The read data path provides a read data word from the write buffer or the memory, when a read address is provided by the data source. The read data path makes the read data word available to the data source within a single cycle.

For example, the read data words, on the subsequent clock cycle, are presented to the data source by either the write buffer, or the memory. The read data words are provided to the data source from the write buffer, if and only if, the read address (on the bus) matches that of the write address contained in a write buffer hold register or a write buffer merge register; otherwise, the data is presented to the data source directly from the memory.

Another embodiment of the present invention is directed to a memory interface circuit. The circuit includes a write data input, an address input, a delayed write data output, a delayed write address output, a read data input and a read data output. A write buffer is coupled between the write data input and the delayed write data output and between the address input and the delayed write address output. An error detection encoder is coupled between the write data input and the delayed write data output. An address comparator compares the address input with the delayed write address output to produce a comparator result. A read multiplexer couples the read data input or the delayed write data output to the read data output based on the comparator result.

BRIEF DESCRIPTION OF THE DRAWINGS

FIG. 1 is a block diagram illustrating a data storage and retrieval circuit according to one embodiment of the present invention.

FIG. 2 is a block diagram illustrating a data storage and retrieval circuit according to an alternative embodiment of the present invention.

FIG. 3 is a state table, which illustrates the data source for a read merge operation.

FIGS. 4A, 4B and 4C together form a state table for a control state machine in the circuit shown in FIG. 2, according to one embodiment of the present invention.

DETAILED DESCRIPTION OF ILLUSTRATIVE EMBODIMENTS

FIG. 1 is a block diagram illustrating a data storage and retrieval circuit 10 having error code generation circuitry, which does not adversely effect critical memory timing paths, according to one embodiment of the present invention. Circuit 10 supports full word write operations. An example of a circuit that supports full and partial word write operations is shown in FIG. 2. Referring to FIG. 1, circuit 10 includes a data source 12, a single cycle access memory 14 and a memory interface 16. In one embodiment, data source 12, memory 14 and memory interface 16 are embedded within a single semiconductor integrated circuit. However, these elements can be implemented on separate devices in alternative embodiments of the present invention.

Data source 12 can include any suitable data source, such as an embedded processor. Data source 12 includes an interface 18 having a write data output 20, a memory address output 21, a read data input 22, and a read/write control output 23. Read/write control output 23 can include appropriate write enables.

Memory 14 includes a delayed write data input 30, a delayed error detection and/or correction code input 31, a delayed address input 32, read data output 33, and a read/write control input 34. For ease of explanation, the error code input 31 and the write data input 30 are shown as separate write data inputs to memory 14. However, these inputs can be combined as a single write data input. For example if the write data has 32 bits and the error code has 7 bits, the combined write data input to memory 14 would have 39 bits.

Memory interface 16 buffers write and read accesses between data source 12 and memory 14. Memory interface 16 includes write encoder 40, registers 41-43, address comparator 44, multiplexer 46, error detection and/or correction circuit 48, and multiplexer 49.

Encoder 40 and registers 41-43 are coupled in the write data path between data source 12 and memory 14. Encoder 40 is coupled between write data output 20 and the input of register 41. The output of register 41 is coupled to delayed error detection and/or correction input 31 of memory 14. In an alternative embodiment, encoder 40 is coupled between register 41 and memory 14. Write data output 20 is also coupled to the input of register 42. The output of register 42 is coupled to delayed write data input 30 of memory 14. Address output 21 is coupled to the input of register 43. The output of register 43 is coupled to one input of multiplexer 49, the output of which is coupled to address input 32 of memory 14. The other input of multiplexer 49 is coupled to address output 21 of data source 12. Registers 41-43, in combination, form a write buffer for buffering write accesses to memory 14.

Address comparator 44, multiplexer 46 and error detection and/or correction circuit 48 are coupled in the read path between read data output 33 of memory 14 and read data input 22 of data source 12. Read data output 33 has a width equal to the width of delayed write data input 30 plus the width of error detection and/or correction code input 31. Read data output 33 is coupled to the input of error detection and/or correction circuit 48, and the output of circuit 48 is coupled to one input of multiplexer 46. The other input of multiplexer 46 is coupled to the output of register 42. The output of multiplexer 46 is coupled to read data input 22.

Address comparator 44 has a first comparator input 50, which is coupled to address output 21 of data source 12, and a second comparator input 52 coupled to the output of address register 43. Address comparator 44 has a comparator output 54, which is coupled to the select input 56 of multiplexer 46.

During a write operation, data source 12 provides a write data word on write data output 20 and a corresponding address on address output 21, which are latched in registers 42 and 43 during the current clock cycle. A "data word" can include a group of data bits having any number of bit positions. In one embodiment, a data word includes 32 bits formed by four 8-bit bytes. Write data output 20 and read data input 22 are therefore 32 bits wide. During the same clock cycle encoder 40 generates a set of error code or check bits based on the pattern formed by the write data word, and these code bits are latched in register 41. Any type of error detection and/or correction code can be used for generating any number of error code bits. For a simple code based on parity, a single parity bit is generated for each data word or byte portion by encoder 40. For more complex error detection and/or correction codes, multiple code bits are generated for each data word or byte portion. In the above example, each data word has 32 bits and encoder 40 generates seven code bits for each write data word, based on the full 32-bit word pattern. However, any other number of bits can be used. For example, one code bit (parity bit) can be generated for each 8-bit byte such that a 4-byte data word would have 4 code bits (parity bits).

The write data word and the error code bits together form an encoded write data word, which is latched in registers 41 and 42. The error code bits can be concatenated to the write data word bits, interleaved with the write data bits or encoded with the write data bits as an entire block, for example. For simplicity, registers 41 and 42 are shown as separate registers, but these registers can also be viewed as a single register.

Since the write data, address and code bits are latched in registers 41-43 in the current clock cycle, memory write accesses through interface 16 are seen as single cycle accesses to data source 12. During the next clock cycle, the latched write data, address, and code bits are applied to memory 14. During a write operation, multiplexer 49 selects the delayed address from register 43 based on read/write control output 23 of data source 12. As shown in FIG. 1, encoder 40 is outside the critical timing path between data source 12 and register 41. Encoder 40 does not add any delay to this write data path. Therefore, the delay incurred in generating the appropriate code bits does not adversely affect the performance of memory 14. However, encoder 40 can be placed between register 41 and memory 14 in an alternative embodiment.

During a read operation, multiplexer 49 applies the address output 21 from data source 12 to memory 14 in order to bypass address register 43. If the memory address provided on output 21 is different than the memory address stored in address register 43 (from a previous write operation), multiplexer 46 selects the read data from output 33 of memory 14, which is passed through the detection and/or correction circuit 48. Based on the error code bits within the read data, circuit 48 detects whether there are any errors in the read data. In the case of an ECC code, circuit 48 is also capable of correcting some of the detected errors. The corrected read data is then applied by multiplexer 46 to read data input 22 of processor 12.

If the read address generated on address output 21 is the same as the address stored in register 43 (from a previous write operation), multiplexer 46 feeds the delayed write data stored in register 42 to data source 12, based on the output of comparator 54.

With the embodiment shown in FIG. 1, if data source 12 attempts to read from an address for which the most recent data resides in register 42 and has not yet been written to memory 14, memory interface 16 simply provides the data from register 42 to read data input 22 based on the address compare result. Since read operations can retrieve data from either memory 14 or register 42, all read operations through memory interface 16 can be performed in a single clock cycle even if a previous write operation can take two or more cycles to complete due to the insertion of registers 41-43. This significantly reduces or eliminates the number of stalls on data source 12 caused by accessing memory 14. Also, in embodiments that support partial word write operations, read operations are given priority over write operations in order to further reduce stalls or wait states on the data source.

While the embodiment shown in FIG. 1 provides advantages to embedded processor and memory designs, tightly-coupled memories and possibly caches, it can also be used in other applications that require increased memory access performance, when utilizing an ECC, or parity memory protection solution.

FIG. 2 is a block diagram illustrating a data storage and retrieval circuit 100 having a memory interface that supports both full and partial data word (e.g., byte, half-word, and word) accesses while applying error detection and/or correction on the full data word, according to an alternative embodiment of the present invention. Circuit 100 includes data source 102, single cycle access memory 104 and memory interface 106. Again, data source 102 can include any type of data source, such as an embedded processor. Memory 104 can be embedded on the same integrated circuit as the data source 102, or can be an external device. In one embodiment, memory 104 is "tightly-coupled" with data source 102, such that memory write and read accesses are seen as being completed in a single cycle from the perspective of data source 102.

Data source 102 has an address output 110, a write data output 111, control outputs 112, stall input 113 and read data input 114. Memory 104 includes address input 120, write data input 121, error detection and/or correction code input 122, write control input 123 and read data output 124. Again, write data input 121 and error detection and/or correction code input 122 are shown as separate write data inputs, but can be viewed as a single input. The error code bits can be concatenated with the write data bits, interleaved with the write data bits, or encoded with the write data bits, for example. In any case, the write data on inputs 121 and 122 together form an encoded write data word.

Memory interface 106 includes write control circuit 130, byte compression multiplexers 132, write data multiplexer 134, encoder 136, write buffer 138, address multiplexer 140, address comparators 141-143, read data multiplexer 144, and error detection and/or correction circuit 146. Read data multiplexer 144 forms part of the read merge circuit 145, which is capable of gathering and merging bytes from different sources, as explained in more detail below.

Write data and write enables from data source 102 are latched in write buffer 138 prior to being applied to memory 104. However, memory interface 106 includes additional circuitry to enable partial word accesses by data source 102 while generating error correction and/or detection codes on the full data word.

In one embodiment, write buffer 138 includes a hold register 150 followed by a merge register register 152. The hold register 150 is used for storing the current write data word, write enables and address from data source 102, and the merge register 152 is used for gathering and merging bytes in a read/modify/write operation.

From data source 102, address output 110 and write data output 111 (with appropriate write enables) are coupled to the inputs of hold register 150. Address output 110 is also coupled to an input of the address multiplexer 140 for bypassing the write buffer 138 during a read operation. Hold register 150 has an address output 154, which is coupled to the input of merge register 152, and a data output 155, which is coupled to an input of the write data select multiplexer 134 and an input of byte compression multiplexer(s) 132. Byte compression multiplexer(s) 132 have a second input coupled to receive memory read data from read data 124 of memory 104. The output of multiplexer(s) 132 is coupled to a second input of write data select multiplexer 134. The output of multiplexer 134 is coupled to the input of merge register register 152. While not shown, the appropriate write enables from hold register 150 can also be latched with the write data in merge register register 152.

Merge register 152 has a delayed address output 170 coupled to a second input of address multiplexer 140, which is coupled to the address input 120 of memory 104. Merge register 152 has a delayed write data output 171 coupled to write data input 121 of memory 104 and to the input of encoder 136. The output of encoder 136 is coupled to error code input 122 of memory 104. In an alternative embodiment, encoder 136 can be located between multiplexer 134 and merge register 152 within write buffer 138, for example.

Data source 102 generates appropriate control signals on control output 112, which are applied to control circuit 130 for controlling write and read operations. These control signals include control bits identifying write and read commands and flags identifying which portions (e.g., bytes) of the data word are valid. For example, with a 32-bit data word, data source 102 can provide four data valid bits on control output 112 to indicate which of the four 8-bit bytes in the data word are valid.

In one embodiment, control circuit 130 is implemented as a state machine. However, control circuit 130 can be implemented in other types of circuits, including hardware, software or a combination of hardware and software. Control circuit 130 generates a variety of control outputs for controlling byte compression/merge multiplexers 132, write select multiplexer 134, hold and merge registers 152 and 152, address multiplexer 140, memory 104 and data source 102. For simplicity, not all control outputs are shown in FIG. 2.

During a full data word write operation, data source 102 provides the write data word to write data output 111, applies the corresponding address to address output 110, and signals control circuit 130 that all bytes are valid. Under the control of circuit 130, the write address, the write data word and write enable bits from data source 102 are applied to hold register 150. During the next clock cycle, the contents of hold register 150 are transferred through write data select multiplexer 134 to merger register register 152. In a next subsequent clock cycle, the contents of merge register 152 are applied to memory 104 along with the error code bits generated by encoder 136. In that same cycle, address multiplexer 140 selects the delayed address from address output 170. The delayed write data and error code bits together form a delayed, encoded write data word.

When data source 102 writes a partial word to memory 104, memory interface 106 performs a read/modify/write operation. During a first clock cycle, the write address, the write data and write enable bits from data source 102 are applied to hold register 150. Control circuit 130 operates on address multiplexer 140 to apply the current address from data source 102 to memory 104 so that the data word currently stored at that address is read onto read data output 124. During a second clock cycle, byte compression multiplexers 132 merge the valid data bytes on output 155 from hold register 150 with bytes from the read data word, and bit-error corrected by ECC block 146, if and only if, a bit-error is present, to form a modified data word. The modified data word is applied to merge register 152 through write data select multiplexer 134. In a third clock cycle, the contents of merge register 150 are applied to memory 104.

Referring to the read data path, address comparators and read merge circuit 145 operate so that all read operations are seen by data source 102 as occurring in a single clock cycle. Address comparator 141 has first and second compare inputs coupled to the current address on address output 110 of data source 102 and address output 154 of hold register 150. Address comparator 142 has first and second compare inputs coupled to the current address on address output 110 of data source 102 and the delayed address on output 170 of merge register register 152. Address comparator 143 has first and second compare inputs coupled to the address outputs of the hold and merge registers, respectively. The outputs of comparators 141-143 are applied to read merge circuit 145 for controlling multiplexers 144.

In one embodiment, multiplexers 144 can select read data from memory 104, hold register 150 or merge register 152 on a byte basis. In a typical read operation, comparators 141-143 compare the current read address from data source 102 with the addresses stored in the hold and merge registers. If there is a match and the particular register is full with valid data, that data is fed back from the register to data source through multiplexers 144. If no match is found, the read data 124 from memory 104 is fed back to data source 102 through multiplexers 144. In either case, the read data is obtained by data source 102 in a single clock cycle.

In the case where data source 102 issues a read to an address for which a read/modify/write is in operation, multiplexers 144 can select the most recent, valid bytes from hold register 150, merge register 152 and/or memory 102 and merge them together onto read data input 114 of data source 102. These bytes are selected based on the results of the address comparisons and the states of the data valid bits in each register. In this embodiment, the read data can be retrieved from (1) either the hold or merge registers; (2) a combination of the hold and merge registers; (3) a combination of the hold register and memory 104; (4) a combination of the merge register and memory 104; or (5) directly from memory 104 if none of the three address comparators generates a "hit". These combinations of data sources for a read merge operation are summarized in more detail in FIG. 3, according to one embodiment of the present invention.

Again, all bytes are retrieved by data source 102 in a single clock cycle. Also, write operations appear to data source 102 as being completed in a single clock cycle. Control circuit 130 stalls data source 102 only when data source 102 initiates a partial word write transaction while write buffer 138 is attempting to write to memory 104. In this instance, data source 102 is stalled for one clock cycle until the read/modify/write operation has completed. However, all read operations are given priority over write operations such that no stalls occur on data source 102 due to a read operation. Rather, advancement of the write buffer is stalled until completion of the read operation.

The memory interface shown in FIG. 2 can be modified, if desired to further reduce wait states in write buffer 138 when the data source address matches the address in hold register 150. A wait state can be avoided by (1) writing the contents of merge register 152 to memory 104; (2) moving the contents of hold register 150 to merge register 152; and (3) moving the write data from data source 102 to hold register 150. In the next clock cycle, address comparator 143 generates a "hit" since the addresses in the hold and merge registers match one another. In response to the address match, the most recent data (full or partial word) from hold register 150 is gathered into merge register 152 by overwriting the previous contents.

As mentioned above, write control circuit 130 can be implemented as a state machine. In one example, the state machine has six valid states, which depend on the conditions of the hold register and the merger register. The hold register can be "empty", "partial", and "full", while the merge register can only be "full", thus, yielding the six valid states of the nine possible combinations. The merge register contains "partial" content, if and only if, the read/merge/write operation is disabled. Disabling of the read/merge/write functionality is utilized in benchmark testing between a system containing and/or not containing the aforementioned read/merge/write operation. In the "empty" condition, the hold or merge registers do not contain any valid data. In the "partial" condition, the hold register contains unmerged partial word data (again, a "partial" word can only be present in the merge register if the read/merge/write functionality is disabled). In the "full" condition, the hold or merge register contains a full, or merged data word (a modified full word from a read/modify/write).

The following discussion provides a description of the actions performed within each state in response to a give stimulus, such as a "WordWrite", "SubwordWrite", "Read", "NOP", or "Wait". Each of these six valid states are defined below:

State 1: HoldRegEmpty && MergeRegEmpty
  A. WordWrite
    Load the hold register with Word data from data source 102.
    Next state=(HoldRegFull && MergeRegEmpty)

B. SubwordWrite
  Load the hold register with Subword data from data source 102 and issue memory read for a read-modify-write operation.
  Next state=(HoldRegPartial && MergeRegEmpty)
C. Read
  Read directly from memory 104 conditioned on the Address Comparator (AC).
  Next state=(HoldRegEmpty && MergeRegEmpty)
D. Memory NOP
  Maintain the current state.
  Next state=(HoldRegEmpty && MergeRegEmpty)

State 2: HoldRegEmpty && MergeRegFull
  A. WordWrite
    Write the hold register with word data from data source 102 and write memory 104 with merge register data.
    Next state=(HoldRegFull && MergeRegEmpty)
  B. SubwordWrite
    Write the hold register with Subword data from data source 102 and issue memory read for a read-modify-write operation. The merge register is maintained.
  C. Read
    Read data from the Write Buffer (WB) merge register, or memory 104 conditioned on the Address Comparator (AC).
    Next state=(HoldRegEmpty && MergeRegFull)
  D. Memory NOP
    Write memory 104 with merge register data.
    Next state=(HoldRegEmpty && MergeRegEmpty)

State 3: HoldRegPartial && MergeRegEmpty
  A. WordWrite
    Write the merge register with the hold register (merge the hold register contents with that of the current memory read data) and write the hold register with Word data from datasource 102.
    Next state=(HoldRegFull && MergeRegFull)
  B. SubwordWrite
    Write the merge register with the hold register (merge the hold register contents with that of the current memory read data), write the hold register with Subword data from data source 102, and issue a read for a read/modify/write operation.
    Next State=(HoldRegPartial && MergeRegFull)
  C. Read
    Write the merge register with the hold register (merge the hold register contents with that of the current memory read data) and read data from memory 104 or the merged data word from the Write Buffer (WB) hold register and memory 104 conditioned on the Address Comparator (AC).
    Next state=(HoldRegEmpty && MergeRegFull)
  D. Memory NOP
    Write the merge register with the hold register (merge the hold register contents with that of the current memory read data).
    Next state=(HoldRegEmpty && MergeRegFull)

State 4: HoldRegPartial && MergeRegFull
The following states use a flag, HOLDMERGE_CMP. If HOLDMERGE_CMP is not asserted (logic "0"), the address contained in the hold register does not match the address contained in the merge register. When this flag is asserted (logic "1"), this flag indicates that the address contained in the hold and merger registers match one another.
  A. WordWrite
    (HOLDMERGE_CMP=0) Write memory 104 with the merge register data, write the merge register with the hold register (merge the hold register contents with that of the current, or previous memory read data), and write the hold register with Word data from data source 102.
    (HOLDMERGE_CMP=1) Write the merge register with the valid bytes of the hold register, maintain the valid bytes of the merge register, and write the hold register with Word data from data source 102.
    Next state=(HoldRegFull && MergeRegFull)
  B. SubwordWrite
    (HOLDMERGE_CMP=0) Write the memory 104 with the merge register data, write the merge register with the hold register (merge the hold register contents with that of the current, or previous memory read data), write the hold register with Subword data, issue a Wait on memory 104 interface, and issue a memory read for a read-modify-write operation during the Wait.
    (HOLDMERGE_CMP=1) Write the merge register with the valid bytes of the hold register, maintain the valid bytes of the merge register, write the hold register with subword data, and issue a memory read for a read-modify-write operation.
    Next state=(HoldRegPartial && MergeRegFull)
  C. Read
    Register the previous memory read, under the conditions defined in the table below, and read data from the Write Buffer (WB) hold/merge register, or memory 104 conditioned on the Address Comparator (AC). The following logic table illustrates the Next State

| HOLD_CMP | MERGE_CMP | HOLDMERGE_CMP | LD_PREV_READ_DATA | NEXT STATE |
|---|---|---|---|---|
| 0 | 0 | 0 | 1 | HoldRegPartial MergeRegFull |
| 1 | 0 | 0 | 1 | HoldRegPartial MergeRegFull |
| 0 | 1 | 0 | 1 | HoldRegPartial MergeRegFull |
| 1 | 1 | 1 | 0 | HoldRegEmpty MergeRegFull |
| 0 | 0 | 1 | 0 | HoldRegEmpty MergeRegFull |

In the above table, the bit pattern formed by the first three columns indicate the following operations:
000 Read memory
100 Merge contents of memory and hold register 010 Read merge register
111 Gather hold register in merge register and read from merge register
001 Gather hold register in merge register and read from memory D. Memory NOP (HOLDMERGE_CMP=0) Write memory 104 with the merge register data and write the merge register with the hold register (merge the hold register contents with that of the current, or previous memory read data).

Next state=(HoldRegEmpty && MergeRegFull)

(HOLDMERGE_CMP=1) Write the merge register with the valid bytes of the hold register and maintain the valid bytes of the merge register. This is a gathering operation controlled via the hold register write enables.

Next state=(HoldRegEmpty && MergeRegFull)

E. Wait

Issue a memory read for a read-modify-write operation using the hold address register content and clear the Wait signal.

Next state=(HoldRegPartial && MergeRegFull)

State 5: HoldRegFull && MergeRegFull

A. WordWrite (HOLDMERGE_CMP=0) Write memory 104 with the merge register data, write the merge register with the hold register, and write the hold register with Word data.

(HOLDMERGE_CMP=1) Write the merge register with the hold register and write the hold register with Word data.

Next state=(HoldRegFull && MergeRegFull)

B. SubwordWrite (HOLDMERGE_CMP=0) Write memory 104 with the merge register data, write the merge register with the hold register (merge the hold register contents with that of the current memory read data), write the hold register with Subword data, and issue a Wait on the memory interface (issue a memory read for a read-modify-write operation during the Wait).

(HOLDMERGE_CMP =1) Write the merge register with the valid bytes of the hold register (overwrite), load the hold register with the subword data, and issue a read for a read/modify/write operation.

Next state=(HoldRegPartial && MergeRegFull)

C. Read

Read data from the Write Buffer (WB) hold/merge register or memory 104 conditioned on the Address Comparator (AC).

The Next State is defined by the following logic table:

| HOLD_CMP | MERGE_CMP | HOLDMERGE_CMP | NEXT STATE |
|---|---|---|---|
| 0 | 0 | 0 | HoldRegFull MergeRegFull |
| 1 | 0 | 0 | HoldRegFull MergeRegFull |
| 0 | 1 | 0 | HoldRegFull MergeRegFull |
| 1 | 1 | 1 | HoldRegEmpty MergeRegFull |
| 0 | 0 | 1 | HoldRegEmpty MergeRegFull |

In the above table, the bit pattern formed by the first three columns indicate the following operations:

000 Read memory
100 Read hold register
010 Read merge register
111 Overwrite merge register with hold register and read from merge register
001 Overwrite merge register with hold register and read from memory D. Memory NOP (HOLDMERGE_CMP=0) Write memory 104 with the merge register data and write the merge register with the hold register.

(HOLDMERGE_CMP=1) Write the merge register with the contents of the hold register.

Next state=(HoldRegEmpty && MergeRegFull)

E. Wait

Issue a memory read for a read-modify-write operation using the hold address register content and clear the Wait signal.

Next state=(HoldRegPartial && MergeRegFull)

State 6: HoldRegFull && MergeRegEmpty

A. WordWrite

Write the merge register with the hold register and write the hold register with Word data.

Next state=(HoldRegFull && MergeRegFull)

B. SubwordWrite

Write the merge register with the hold register, write the hold register with Subword data, and issue a memory read for read-modify-write operation.

Next state=(HoldRegPartial && MergeRegFull)

C. Read

Write the merge register with the hold register and read data from the Writer Buffer (WB) hold register, or memory 104 conditioned on the Address Comparator (AC).

Next state=(HoldRegEmpty && MergeRegFull)

D. Memory NOP

Write the merge register with the hold register.

Next state=(HoldRegEmpty && MergeRegFull)

FIGS. 4A, 4B and 4C together form a state table for control circuit 130 shown in FIG. 2, which controls the transitions between the above-described states, according to one embodiment of the present invention. FIG. 4A illustrates the states for a word write operation. FIG. 4B illustrates the states for a subword write operation. FIG. 4C illustrates the states for a read operation.

The embodiment shown in FIG. 2 and described above allows partial word (subword) accesses to be made while maintaining a full word error detection and/or correction scheme. Since the error detection and/or correction code is applied to a full data word, a smaller number of code bits can be used. For example, a typical word-based ECC requires only 39 bits for a standard 32-bit word, while, a byte-based ECC would require 52-bits for a standard 32-bit word; therefore, a full word error detection and/or correction scheme provides a significant area and cost saving since each encoded data word has thirteen less bits than would be required for a byte-based ECC scheme.

In addition, the error detection and/or correction encoder can be removed from the critical write timing path without incurring any additional stall cycles on the data source. This increases the possible operating frequency of the system. The write control stalls the data source, if and only if, there is a transaction that conflicts with the write of a modified data word.

Although the present invention has been described with reference to illustrative embodiments, workers skilled in the art will recognize that changes may be made in form and detail without departing from the spirit and scope of the invention. For example, the write encoder can be moved to other locations along the write data path or duplicated in alternative embodiments of the present invention. The stall signal from the write control circuit can be eliminated or used in other ways such as by gating a clock signal to the data source. The location and number of the various multiplexers can also be modified in alternative embodiments of the present invention. Other functions, in addition to error detection and/or correction functions can be performed on the address or data without departing from the scope of the present invention. Also the write encoder can implement any detection and/or correction algorithm.

What is claimed is:

1. A method of interfacing between a data source and a tightly-coupled memory, the method comprising:
   (a) receiving a write data word and a write address from the data source;
   (b) latching the write address and the write data word in a write buffer along a write data path between the data source and the memory;
   (c) encoding the write data word according to an error detection code along the write data path;
   (d) after step (b), applying the write address and the write data word from the write buffer to the memory;
   (e) performing steps (a) and (b) in a first clock cycle; and
   (f) making the write data word accessible to the data source from the write data path or the memory beginning with a second clock cycle, which is a next subsequent clock cycle to the first clock cycle.

2. The method of claim 1 wherein:
   step (c) comprises encoding the write data word stored in the write buffer with an encoder located in the write data path between the write buffer and the memory.

3. The method of claim 1 wherein (c) comprises encoding the write data word according to a parity code.

4. The method of claim 1 wherein (c) comprises encoding the write data word according to an error correction code (ECC).

5. The method of claim 1 step (d) of applying the write address and the write data word from the write buffer to the memory is executed in a different clock cycle than steps (a) and (b).

6. The method of claim 1 and further comprising performing the method on an integrated circuit in which both the data source and the memory are embedded and tightly coupled to one another.

7. The method of claim 1 wherein:
   step (a) comprises receiving a write data word having a valid subword portion and an invalid subword portion;
   step (b) comprises:
     (b) (1) latching the write data word in the write buffer;
     (b) (2) reading a read data word from a location in the memory corresponding to the write address; and
     (b) (3) merging the valid subword portion with a portion of the read data word to form a modified write data word; and
   step (c) comprises encoding the modified write data word according to the error detection code.

8. The method of claim 7 and further comprising:
   (g) receiving a read address from the data source subsequent to receiving the write data word and write address in step (a); and
   (h) reading a data word from a location in the memory corresponding to the read address prior to applying the write address and the write data word from the write buffer to the memory in step (d).

9. The method of claim 7 wherein:
   step (b) (1) comprises latching the write data word and the write address in a hold register within the write buffer;
   step (b) (3) comprises transferring the write address to a merge register, merging the valid subword portion from the hold register with the portion of the read data word from the memory to form the modified write data word, and latching the modified write data word in the merge register; and
   step (d) comprises transferring the write address and the modified write data word from the merge register to the memory.

10. The method of claim 1 wherein:
    the write buffer comprises a first register followed by a second register along the write data path, each of which storing a respective write data word and a respective write address;
    step (a) comprises receiving a further write address and a further write data word and having a valid word portion from the data source; and
    step (b) comprises:
      (b) (1) transferring the write data word and the write address stored in the second register to the memory;
      (b) (2) transferring the write data word and the write address stored in the first register to the second register;
      (b) (3) transferring the further write address and write data word from the data source to the first register; and
      (b) (4) overwriting a corresponding portion of the write data word stored in the second register after step (b) (2) with the valid word portion of the further write data word stored in the first register after step (b) (3) if the write address in the first register matches the write address in the second register.

11. The method of claim 1 and further comprising:
    (g) receiving a read address from the data source; and
    (h) applying the write data word from the write buffer or a read data word from the memory to the data source based on a comparison of the read address from the data source and the write address that is stored in the write buffer.

12. The method of claim 11 wherein:
    step (b) comprises:
      latching the write data word and the write address in a first register within the write buffer; and
      latching the write data word and the write address that is stored in the first register in a second register within the write buffer;
    step (d) comprises:
      applying the write address and the write data word that is stored in the second register to the memory; and
    step (h) comprises:
      applying the read data word from the memory to the data source if the read address does not match the write address stored in the first register or the write address stored in the second register;
      applying the write data word from the first register to the data source if the read address matches the write address stored in the first register; and
      applying the write data word from the second register to the data source if the read address matches the write address stored in the second register.

13. The method of claim 12 wherein the write buffer comprises a first register followed by a second register along the write data path, each of which for storing a respective write data word and a respective write address, and wherein the method further comprises:
  (g) receiving a read address from the data source; and
  (h) applying a read data word to the data source in response to the read address in step (g), wherein the read data word is retrieved from (1) the first register; (2) the second register; (3) a combination of the first and second registers; (4) a combination of the first register and the memory; (5) a combination of the second register and the memory; or (6) directly from the memory based on a comparison of the read address with the write addresses stored in the first and second registers and a comparison of the write address stored in the first register with the write address stored in the second register and corresponding data valid bits.

14. An integrated circuit data storage and retrieval device comprising:
  a memory;
  a data source for providing write data words, corresponding write addresses and read addresses to the memory;
  a write data path from the data source to the memory, which comprises a write buffer and an error detection encoder, wherein the write buffer latches the write data words and write addresses prior to applying the write data words and write addresses to the memory; and
  a read data path from the memory and the write data path to the data source, which provides a read data word from the memory or the write buffer when the data source provides a read address, and wherein the read data word is available to the data source from the read data path within a single clock cycle.

15. The device of claim 14 wherein the data source and the memory are embedded in the same integrated circuit and are tightly coupled to one another.

16. The device of claim 14 wherein the write buffer comprises:
  a hold register and a merge register coupled in series with one another between the data source and the memory; and
  a compression circuit, which is coupled between the hold and merge registers and selectively merges a portion of a write data word stored in the hold register with a portion of a read data word received from the memory to form a modified write data word, which is applied to the merge register.

17. The device of claim 14 wherein:
  the write data path further comprises a write address multiplexer, which multiplexes the write addresses latched in the write buffer with the read addresses provided by the data source, for application to the memory.

18. The device of claim 14 wherein:
  the write buffer comprises a hold register and a merge register coupled in series with one another between the data source and the memory; and
  the read data path comprises a read multiplexer, which selectively couples a read data word to the data source in response to each of the read addresses, wherein the read multiplexer retrieves the read data word from (1) the hold register; (2) the merge register; (3) a combination of the hold and merge registers; (4) a combination of the hold register and the memory; (5) a combination of the merge register and the memory; or (6) directly from the memory based on a comparison of each read address with any write addresses stored in the hold and merge registers and a comparison of any write address stored in the hold register with any write address stored in the merge register and corresponding data valid bits stored in the hold and merge registers.

19. A memory interface circuit comprising:
  a write data input, an address input, a delayed write data output, a delayed write address output, a read data input and a read data output;
  a write buffer coupled between the write data input and the delayed write data output and between the address input and the delayed write address output;
  an error detection encoder coupled in a write data path between the write data input and the delayed write data output;
  an address comparator, which compares the address input with the delayed write address output to produce a comparator result; and
  a multiplexer, which couples the read data input or the delayed write data output to the read data output based on the comparator result.

* * * * *